(12) United States Patent
Abraham

(10) Patent No.: US 7,233,062 B2
(45) Date of Patent: Jun. 19, 2007

(54) INTEGRATED CIRCUIT PACKAGE WITH IMPROVED ELECTRO-STATIC DISCHARGE PROTECTION

(75) Inventor: Robert A. Abraham, Albany, OR (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 0 days.

(21) Appl. No.: 10/837,014

(22) Filed: Apr. 30, 2004

(65) Prior Publication Data

US 2005/0242415 A1    Nov. 3, 2005

(51) Int. Cl.
*H01L 21/50* (2006.01)
*H01L 23/48* (2006.01)

(52) U.S. Cl. ............... 257/690; 257/659; 257/691; 257/692; 257/676

(58) Field of Classification Search ........... 257/689, 257/690, 692, 694, 670, 688, 739, 737, 616, 257/668, 723, 736
See application file for complete search history.

(56) References Cited

U.S. PATENT DOCUMENTS 5,216,278 A * 6/1993 Lin et al. ............... 257/688
5,424,896 A * 6/1995 Pasch et al. ............ 361/56
5,552,951 A * 9/1996 Pasch et al. ............ 361/56

* cited by examiner

*Primary Examiner*—Evan Pert
*Assistant Examiner*—Fazli Erdem

(57) ABSTRACT

An integrated circuit (IC) package having a spark gap feature for electro static discharge protection is disclosed. The IC package includes an integrated circuit package substrate. An integrated circuit die is placed on the package substrate. Also on the package substrate are a first lead trace connected to the integrated circuit die and a second lead trace adjacent the first lead trace. The second lead trace is also connected to the integrated circuit die. The second lead trace has a spark gap feature allowing at least a portion of electro static spike on the second lead trace to jump to the first lead trace. The spark gap feature can be implemented in various ways including a protrusion from the second lead trace to the first lead trace, the protrusion having a sharp vertex proximal to the first lead trace.

2 Claims, 3 Drawing Sheets

INTEGRATED CIRCUIT PACKAGE WITH IMPROVED ELECTRO-STATIC DISCHARGE PROTECTION

BACKGROUND

The present invention relates to integrated circuit (IC) packaging technology, and more particularly, to an IC package having improved protection from electro-static discharges.

Integrated circuits (IC) having thousands or even millions of electronic components and circuit elements are fabricated on an IC die over a semiconductor substrate such as silicon. In this document, the phrase "IC die" includes the electronic components and circuit elements within the IC die. To electrically connect the IC die to other electronic components and to protect the IC die, the IC die is typically packaged within an IC package. A sample IC package 10 is illustrated in FIG. 1A in a perspective view. The IC package 10 often has plastic or ceramic body 14 and encases the IC die within the IC package 10. Further, the IC package 10 includes connection means 11 and 12 to connect, electrically and mechanically, the IC package 10 to other electronic components. For convenience, the connection means 11 and 12 are illustrated as pins 11 and 12; however, it is understood in the art that the connection means 11 and 12 can include other implementations such as ball grid array, connection pad, or others depending in the desired application. To avoid clutter, only two of the twelve illustrated pins are designated with the reference numerals 11 and 12; however, it is known in the industry that the IC package 10 can include any number of pins or connections means including, for example, hundreds of pins.

FIG. 1B illustrates a cut-away top view of the IC package 10 showing the IC die, designated with reference numeral 20, encased within the IC package 10. The IC die 20 is connected to the pins 11 and 12 via lead traces 31 and 32 fabricated over a bottom portion 16 of the IC package 10. Again, to avoid clutter, only two of the twelve illustrated lead traces are designated with the reference numerals 31 and 32; however, it is known in the industry that the IC package 10 can include any number of lead traces. In general, reference number 30 is used to refer to all the lead traces of the IC package 10.

The bottom portion 16 is often called a package substrate 16. Each of the lead traces 31 and 32 are electrically and mechanically connected to an input-output (IO) port (via connection pads on the IC die 20) of the IC die 20 via wire bonds 22 or other suitable methods. To avoid clutter, the electronic and circuit elements within the IC die 20 are not illustrated in the Figures. Also to avoid clutter, only two of the multiple wire bonds are desiganted with reference number 22; however, it is know in the industry that any or all traces can be connected to the IC die 20 via wire bonds 22.

The IC die 20 typically operates at 1.5 to 5 volts (v) depending on implementation. That is, each of the lead traces 30 of the IC package 10 typically carries electrical signals at 1.5 to 5 volts. However, the IC die 20 is often designed and manufactured to withstand temporary voltage spikes of up to two (2) kilovolts (kV) introduced to each of its IO ports. This is because surrounding components or environmental factors may introduce electrostatic discharges (ESD) to pins 11 and 12 (of the IC package 10) which are connected to the IO ports of the IC die 20 via the lead traces 30. Electrostatic discharge (ESD) is the release of static electricity when two objects come into contact. In fact, the IC package 10 may be exposed to even higher level of ESD voltage spikes from which the IC die 20 should protected. To protect the IC die 20 from failure, it would be desirable to reduce or minimize the severity of the ESD spike reaching the IO ports of the IC die 20.

SUMMARY

The need is met by the present invention. In first embodiment of the present invention, an integrated circuit package includes an integrated circuit package substrate. An integrated circuit die is placed on the package substrate. Also on the package substrate are a first lead trace connected to the integrated circuit die and a second lead trace adjacent the first lead trace. The second lead trace is also connected to the integrated circuit die. The second lead trace has a spark gap feature allowing at least a portion of electro static spike on the second lead trace to jump to the first lead trace.

In a second embodiment of the present invention, an integrated circuit package includes an integrated circuit package substrate. An integrated circuit die is placed on the package substrate. Also on the package substrate are a first lead trace connected to the integrated circuit die and a ground trace adjacent to the first lead trace. The ground trace has a first spark gap feature allowing at least a portion of electro static spike on the first lead trace to jump to the ground trace.

In a third embodiment of the present invention, an integrated circuit package includes an integrated circuit package substrate. An integrated circuit die is placed on the package substrate. Also on the package substrate are a first lead trace connected to the integrated circuit die and a second lead trace adjacent to the first lead trace. The second lead trace is connected to the integrated circuit die. A spark gap jumper is placed between the first lead trace and the second lead trace allowing at least a portion of electro static spike on the first lead trace to jump to the second lead trace.

Other aspects and advantages of the present invention will become apparent from the following detailed description, taken in conjunction with the accompanying drawings, illustrating by way of example the principles of the invention.

DETAILED DESCRIPTION

Figure 1A:
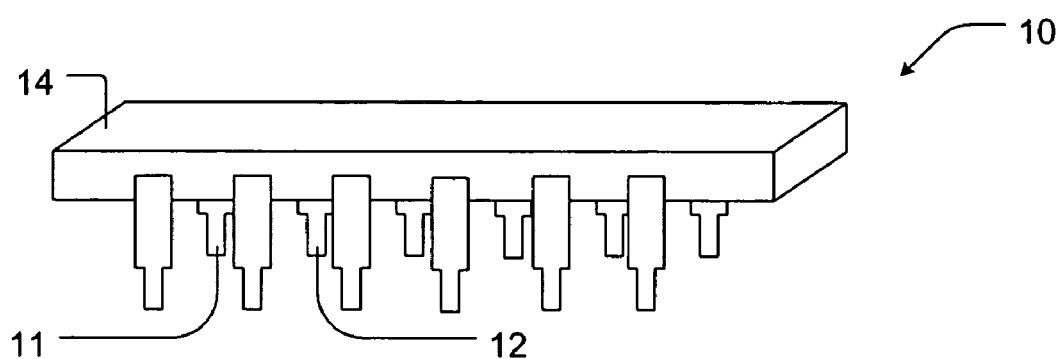
FIG. 1A is a perspective view of a sample integrated circuit (IC) package.

The present invention will now be described with reference to FIGS. 1 through 2G which illustrate various embodiments of the present invention. In the Figures, some sizes of structures or portions may be exaggerated relative to sizes of other structures or portions for illustrative purposes and, thus, are provided to illustrate the general structures of the present invention. Furthermore, various aspects of the present invention are described with reference to a structure or a portion positioned "on" or "over" relative to other structures, portions, or both. As will be appreciated by those of skill in the art, relative terms and phrases such as "on" or "over" are used herein to describe one structure's or portion's relationship to another structure or portion as illustrated in the Figures. It will be understood that such relative-terms are intended to encompass different orientations of the device in addition to the orientation depicted in the Figures. For example, if the device in the Figures is turned over, rotated, or both, the structure or the portion described as "on" or "over" other structures or portions would now be oriented "below," "under," "left of," "right of," "in front of," or "behind" the other structures or portions.

As shown in the Figures for the purposes of illustration, embodiments of the present invention are exemplified by an integrated circuit (IC) package having an integrated circuit package substrate, an integrated circuit (IC) die placed on the package substrate, and lead traces connected to the IC die. A first lead trace connected to the IC die and a second lead trace adjacent the first lead trace is connected to the IC die. The second lead trace has a spark gap feature allowing at least a portion of electro static spike on the second lead trace to jump to the first lead trace.

The ESD voltage spike jump feature protects the IC die encased by the IC package by dividing or sharing ESD spikes on any one pin or lead trace with other lead traces. Accordingly, the severity or degree of the ESD voltage spike on any particular IO port or connection pad of the IC die is reduced.

For example, assume a three (3) kilovolts (kV) ESD voltage spike has hit the second lead trace. Without the present invention, the entire 3 kilovolt ESD spike would be introduced to the IO port (of the IC die) connected to the second lead trace. If the IC die is manufactured to withstand ESD voltage spikes of up to 2 kilovolts (as is commonly done in the industry) on any one IO port, then the 3 kilovolt ESD spike on a single IO port would destroy the IC die and render the entire IC package useless.

With the present invention, the spark gap feature of the second lead trace allows for at least a portion of the 3 kilovolt ESD spike to jump the gap from the second lead trace to the first lead trace thereby dividing the voltage between the two lead traces. As the result, the ESD spike is divided between the first lead trace and the second lead trace. That is, in the present example, a portion (for example, one half) of the 3 kilovolt ESD spike jumps the gap from the second lead trace to the first lead trace such that 1.5 kilovolt ESD spike is introduced on the first lead trace while ESD spike on the second lead trace is reduced to 1.5 kilovolts. Accordingly, for any particular IO port of the IC die, only 1.5 kilovolts are introduced.

Again, if the IC die is manufactured to withstand ESD voltage spikes of up to 2 kilovolts (as is commonly done in the industry) on any one 10 port, then IC die would survive the 3 kilovolt ESD voltage spike on the second lead trace because only 1.5 kilovolts are introduced to any IO port of the IC die.

Figure 1B:
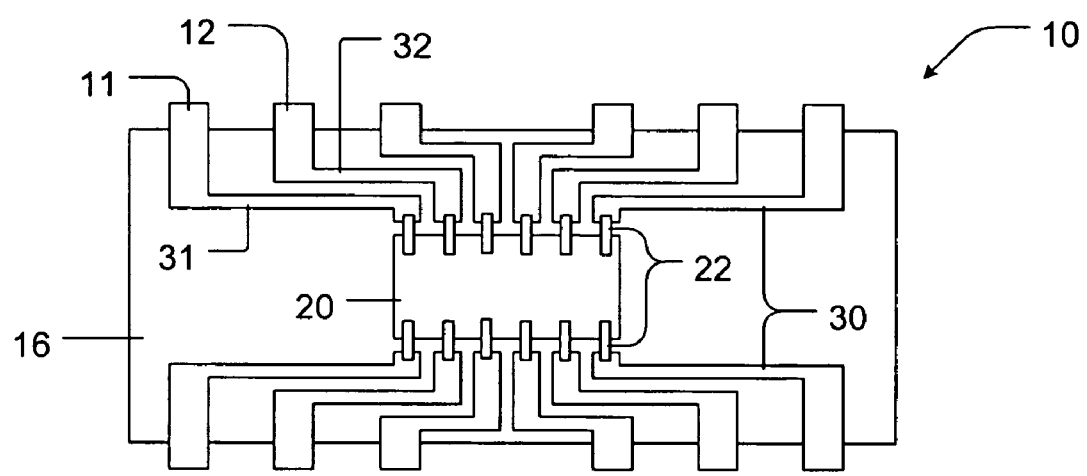
FIG. 1B is a cut-away top view of the IC package of FIG. 1A.
Figure 2A:
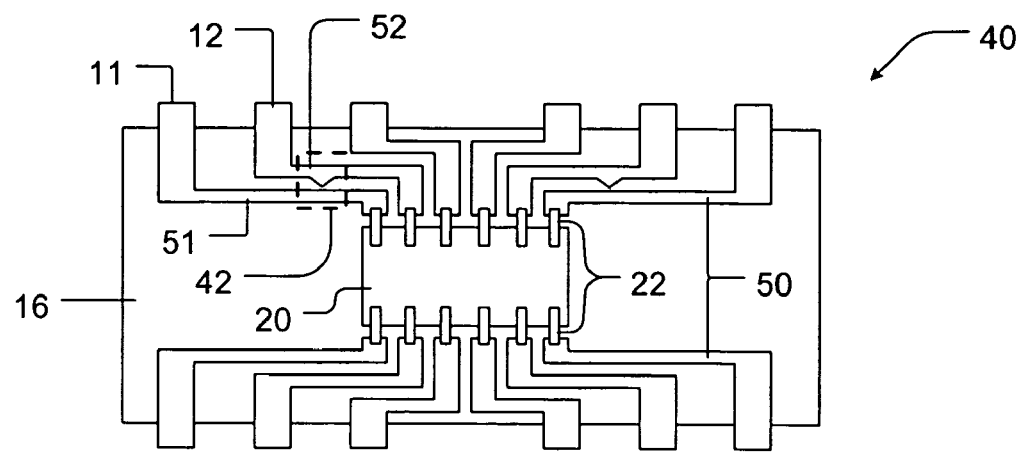
FIG. 2A is a cut-away top view of an IC package in accordance with one embodiment of the present invention.

FIG. 2A is a cut-away top view of an integrated circuit (IC) package 40 in accordance with one embodiment of the present invention. The IC package 40 of FIG. 2A includes portions similar to corresponding portions of the IC package 10 of FIGS. 1A and 1B. For convenience, portions of the IC package 40 of FIG. 2A that are similar to corresponding portions of the IC package 10 of FIGS. 1A and 1B are assigned the same reference numerals; different portions are assigned different reference numerals. A portion 42 of the cut-away top view of the integrated circuit (IC) package 40 is illustrated in more detail in FIG. 2B.

Figure 2B:
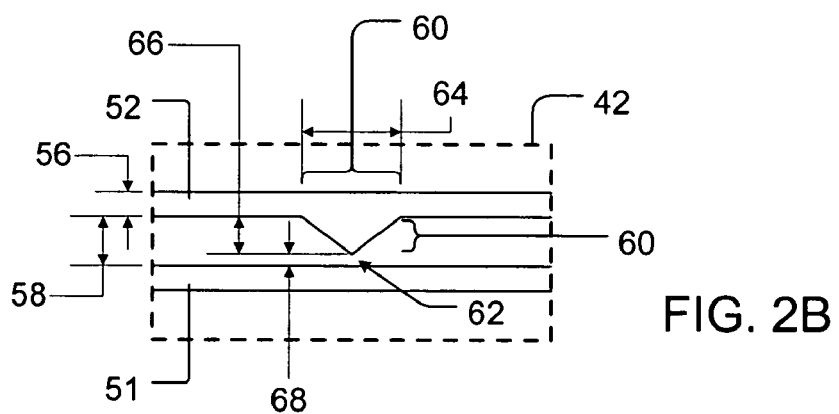
FIGS. 2B, 2C, 2D, 2E, 2F and 2G illustrate alternative embodiments of the IC package of FIG. 2A.

Referring to FIGS. 2A and 2B, the IC package 40 includes an integrated circuit (IC) package substrate 16 on which an integrated circuit (IC) die 20 is placed. A first lead trace 51 connects a first IC port (not designated with a reference number) of the IC die 20 to a first pin 11. The first lead trace 51 is connected to the first IO port via, for example, a wire bond 22. A second lead trace 52 connects a second 10 port (not designated with a reference number) of the IC die 20 to a second pin 12. The second lead trace 52 connects to the second IO port via, for example, a wire bond 22. The second lead trace 52 is adjacent to but not touching the first lead trace 51.

To avoid clutter, only two of the twelve illustrated lead traces are designated with the reference numerals 51 and 52; however, it is known in the industry that the IC package 40 can include any number of lead traces. In general, reference number 50 is used to refer to all the lead traces of the IC package 40. The lead traces 50 are made of electrically conductive material. Typically, the lead traces 50 have widths 56 ranging in the order of millimeters (mm) or fractions of millimeters. However, this can vary greatly (even outside the specified range) depending on the desired application and implementation. Further, separation 58 between the first lead trace 51 and the second lead trace 52 can range vary greatly depending on the desired application and implementation.

In the illustrated sample embodiment, the separation 58 ranges in the order of millimeters (mm) or fractions of millimeters. In fact, the separation 58 between the first lead trace 51 and the second lead trace 52 can vary within the same IC package 20 depending on the layout of the lead traces 50. The lead traces are often coated with protective coating using materials such as Nitto HC 100XJAA or MP8000CH4 molding compounds. Their dielectric strength runs from, for example, approximately 371 to approximately 870 volts per mil.

The second lead trace 52 includes a spark gap feature 60. In the sample embodiment of FIGS. 2A and 2B, the spark gap feature 60 is illustrated as a spark gap protrusion 60 toward the first lead trace 51, the protrusion 60 having generally triangular shape and a sharp vertex 62 proximal to the first lead trace 51. Further, in the illustrated embodiment, the spark gap feature 60 has a width 64 ranging in the order of millimeters or fractions of millimeters depending on implementation. Its depth 66 should be sufficient to almost span the separation 58 between the first lead trace 51 and the second lead trace 52 while leaving a gap 68 between the vertex 62 and the first lead trace 51.

When the ESD voltage spike (for example, 3 kilovolt ESD spike) is introduced to the second lead trace 52, the ESD spike jumps the gap 68 thereby dividing the ESD spike voltage between the first lead trace 51 and the second lead trace 52. The degree to which the ESD voltage spike jumps the gap 68 depend on many factors including, primarily, the geometry of the gap 68, dielectric strength of the material within the gap 68, and the gap distance between the vertex 62 and the first lead trace 51 (defining the size of the gap 68). As for the geometry, it is preferable to have a single sharp vertex 62 for the spark gap feature 60 to allow the ESD voltage to be concentrated at a relatively small area.

As already discussed, the lead traces 50 are often covered by a protecting coat using coating material such as, for example, Nitto MP8000CH4. The material has dielectric strength of approximately 371 to 870 volts per mil. If the spark gap feature 60 can be left exposed to air, the dielectric strength of material (air) within the gap 68 is approximately 20 to 75 volts per mil.

The distance of the gap 68 depends on the geometry, the dielectric strength of the gap material, and the relative signal strength of the applied voltage. To allow an ESD spike of 2 kilovolts or more to jump the gap 68, for the illustrated embodiment of the present invention, the gap distance 68 is within a range in the order of 27 to 100 mils for an air gap, or 2.3 mils for dielectric gap having dielectric material with a dielectric strength of, for example, approximately 870 volts per mil.

The shape and the size of the spark gap protrusion 60 can vary as illustrated in FIGS. 2C through 2G and discussed further below. Alternate embodiments of the IC package 40 including alternate embodiments of the detailed portion 42 are illustrated in FIGS. 2C through 2G. The detailed portions 42c through 42g illustrated in FIGS. 2C through 2G, respectively, include parts similar to corresponding parts of the detailed portion 42 of FIGS. 2A and 2B. For convenience, parts of the detailed portions 42c through 42g illustrated in by FIGS. 2C through 2G, respectively, that are similar to corresponding parts of the detailed portion 42 of FIGS. 2A and 2B are assigned the same reference numerals; similar but changed parts are assigned the same reference numeral followed by a letter "c" through "g"; and different parts are assigned different reference numerals.

Figure 2C:
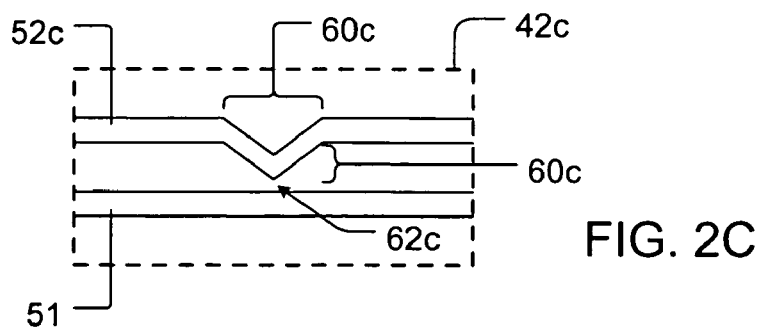

Referring to FIG. 2C, in the illustrated embodiment, the spark gap feature 60c includes a bent portion 60c in place of the protrusion 60 of FIG. 2A. The bent portion 60c has a sharp vertex 62c proximal to the first lead trace 51.

Figure 2D:
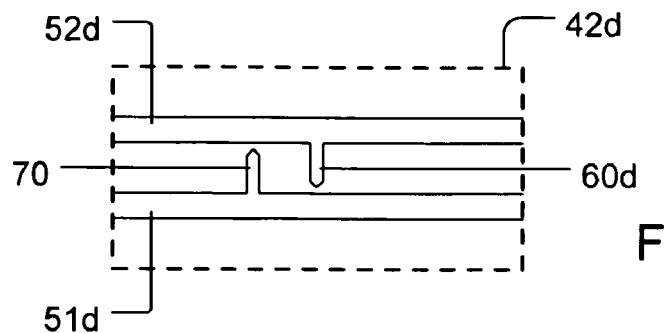

Referring to FIG. 2D, in the illustrated alterative embodiment, the protrusion 60d is not triangular but is a linear protrusion 60d having a sharp point proximal to the first lead trace 51d. Here, the first lead trace 51d also has a spark gap feature 70 allowing at least a portion of electro static spike on the first lead trace 51d to jump to the second lead trace 52d. The first lead trace spark gap feature 70 can be implemented as a protrusion 70 having a sharp point, or vertex, proximal to the second lead trace 52d.

Figure 2E:
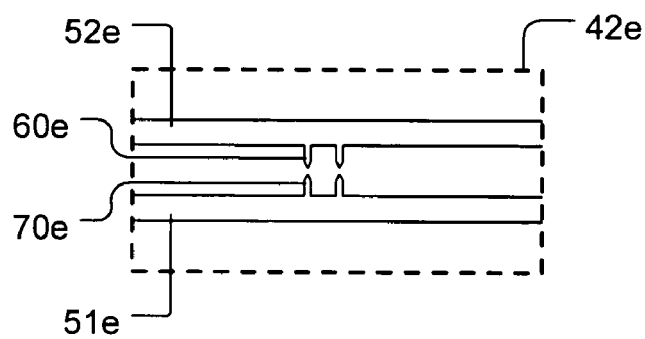

Referring to FIG. 2E, in the illustrated alterative embodiment, both the first lead trace 51e and the second lead trace 52e include the spark gap feature 60e and 70e, respectively, each spark gap feature extending toward the other spark gap feature. Further, the both the first lead trace 51e and the second lead trace 52e include multiple instances of the spark gap feature 60e and 70e, respectively.

Figure 2F:
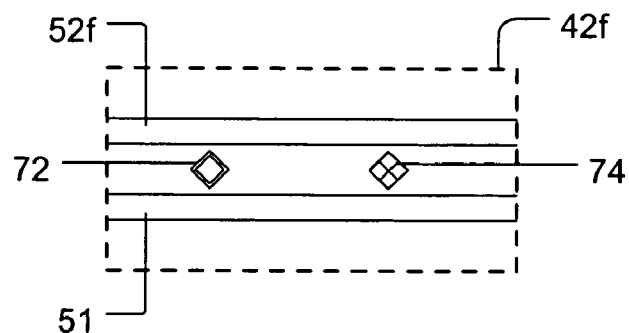

Referring to FIGS. 2A and 2F, in the illustrated alterative embodiment, a spark gap jumper 72 is fabricated between a first lead trace 51 and the second lead trace 52f, the spark gap jumper 72 allowing at least a portion of electro static spike on the first lead trace to jump to the second lead trace and visa versa. In a first embodiment of the spark gap jumper 72, a wire trace having a shape of hollow diamond is illustrated. The hollow diamond shaped spark gap jumper 72 includes a sharp vertex proximal to each of the first lead trace 51 and the second lead trace 52f. These vertices are two of the four vertices of the diamond shape of the hollow diamond shaped spark gap jumper 72. FIG. 2F also illustrates another embodiment of the spark gap jumper as a filled in (not hollow) diamond shaped spark gap jumper 74. The diamond shaped spark gap jumpers 72 or 74 can be connected to a ground trace lead 76 as illustrated in FIG. 2G.

Figure 2G:
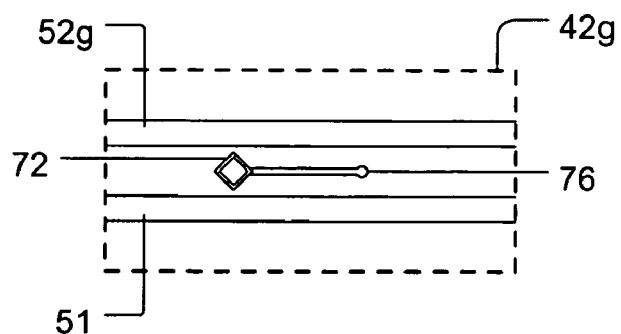

Referring to FIGS. 2A and 2G, in the illustrated alterative embodiment, a ground trace 76 is adjacent to a first lead trace 51 where the ground trace 76 has a spark gap feature allowing at least a portion of electro static spike on the first lead trace 51 to jump to the ground trace 51. In the illustrated embodiment, the spark gap feature is a protrusion toward the first lead trace 51 in the form of a diamond shaped jumper 72, the diamond shaped jumper protrusion 72 has a sharp vertex proximal to the first lead trace 51. Again, the diamond shaped jumper protrusion 72 can have a second sharp vertex proximal to a second lead trace 51g which is also running adjacent to the ground lead trace 76.

From the foregoing, it will be apparent that the present invention is novel and offers advantages over the current art. Although specific embodiments of the invention are described and illustrated above, the invention is not to be limited to the specific forms or arrangements of parts so described and illustrated. For example, differing configurations, sizes, or materials may be used but still fall within the scope of the present invention. The invention is limited by the claims that follow.

What is claimed is:

1. An integrated circuit package comprising:
   an integrated circuit package substrate;
   an integrated circuit die placed on said package substrate;
   a first lead trace connected to said integrated circuit die;
   a second lead trace adjacent to said first lead trace said second lead trace connected to said integrated circuit die;
   a spark gap jumper between said first lead trace and said second lead trace allowing at least a portion of electro static spike on said first lead trace to jump to said second lead trace;
   wherein said first lead trace and said spark gap jumper define a first gap between said first lead trace and said spark gap jumper, said second lead trace and said spark gap jumper define a second gap between said second lead trace and said spark gap jumper; and
   wherein the spark gap jumper comprises a sharp vertex proximal to each of said first lead trace and said second lead trace.

2. The integrated circuit package recited in claim 1 wherein the spark gap jumper is connected to a ground lead trace.

* * * * *